United States Patent
Yu et al.

(10) Patent No.: US 9,324,866 B2
(45) Date of Patent: Apr. 26, 2016

(54) STRUCTURE AND METHOD FOR TRANSISTOR WITH LINE END EXTENSION

(75) Inventors: Shao-Ming Yu, Hsinchu (TW);
 Chang-Yun Chang, Taipei (TW);
 Chih-Hao Chang, Chu-Bei (TW);
 Hsin-Chih Chen, Tucheng (TW);
 Kai-Tai Chang, Kaohsiung (TW);
 Ming-Feng Shieh, Yongkang (TW);
 Kuei-Liang Lu, Hsinchu (TW); Yi-Tang Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 90 days.

(21) Appl. No.: 13/356,235

(22) Filed: Jan. 23, 2012

(65) Prior Publication Data

US 2013/0187237 A1    Jul. 25, 2013

(51) Int. Cl.
| | |
|---|---|
| *H01L 21/8238* | (2006.01) |
| *H01L 27/092* | (2006.01) |
| *H01L 29/78* | (2006.01) |
| *H01L 29/417* | (2006.01) |
| *H01L 29/66* | (2006.01) |

(52) U.S. Cl.
 CPC ...... *H01L 29/785* (2013.01); *H01L 21/823807* (2013.01); *H01L 21/823814* (2013.01); *H01L 21/823821* (2013.01); *H01L 29/41783* (2013.01); *H01L 29/41791* (2013.01); *H01L 29/66795* (2013.01)

(58) Field of Classification Search
 CPC ............... H01L 21/8238; H01L 21/823807; H01L 21/823814; H01L 21/823821; H01L 27/092; H01L 29/78; H01L 29/785
 USPC ............................ 257/369, E27.062, E21.632
 See application file for complete search history.

(56) References Cited

U.S. PATENT DOCUMENTS

| | | | |
|---|---|---|---|
| 7,525,160 B2 | 4/2009 | Kavalieros | |
| 7,786,518 B2 | 8/2010 | Chakravarthi | |
| 8,232,627 B2 * | 7/2012 | Bryant et al. | 257/623 |
| 8,502,301 B2 * | 8/2013 | Suzuki et al. | 257/327 |
| 8,557,666 B2 * | 10/2013 | Wei et al. | 438/294 |
| 2008/0111194 A1 * | 5/2008 | Kawakita | 257/365 |
| 2008/0237634 A1 * | 10/2008 | Dyer et al. | 257/190 |
| 2008/0242024 A1 * | 10/2008 | Sugioka | 438/259 |
| 2012/0292637 A1 | 11/2012 | Beyer | |

* cited by examiner

*Primary Examiner* — Ermias Woldegeorgis
*Assistant Examiner* — Benjamin Tzu-Hung Liu
(74) *Attorney, Agent, or Firm* — Haynes and Boone, LLP

(57) ABSTRACT

The present disclosure provides a semiconductor structure. The semiconductor structure includes a semiconductor substrate; an isolation feature formed in the semiconductor substrate; a first active region and a second active region formed in the semiconductor substrate, wherein the first and second active regions extend in a first direction and are separated from each other by the isolation feature; and a dummy gate disposed on the isolation feature, wherein the dummy gate extends in the first direction to the first active region from one side and to the second active region from another side.

15 Claims, 5 Drawing Sheets

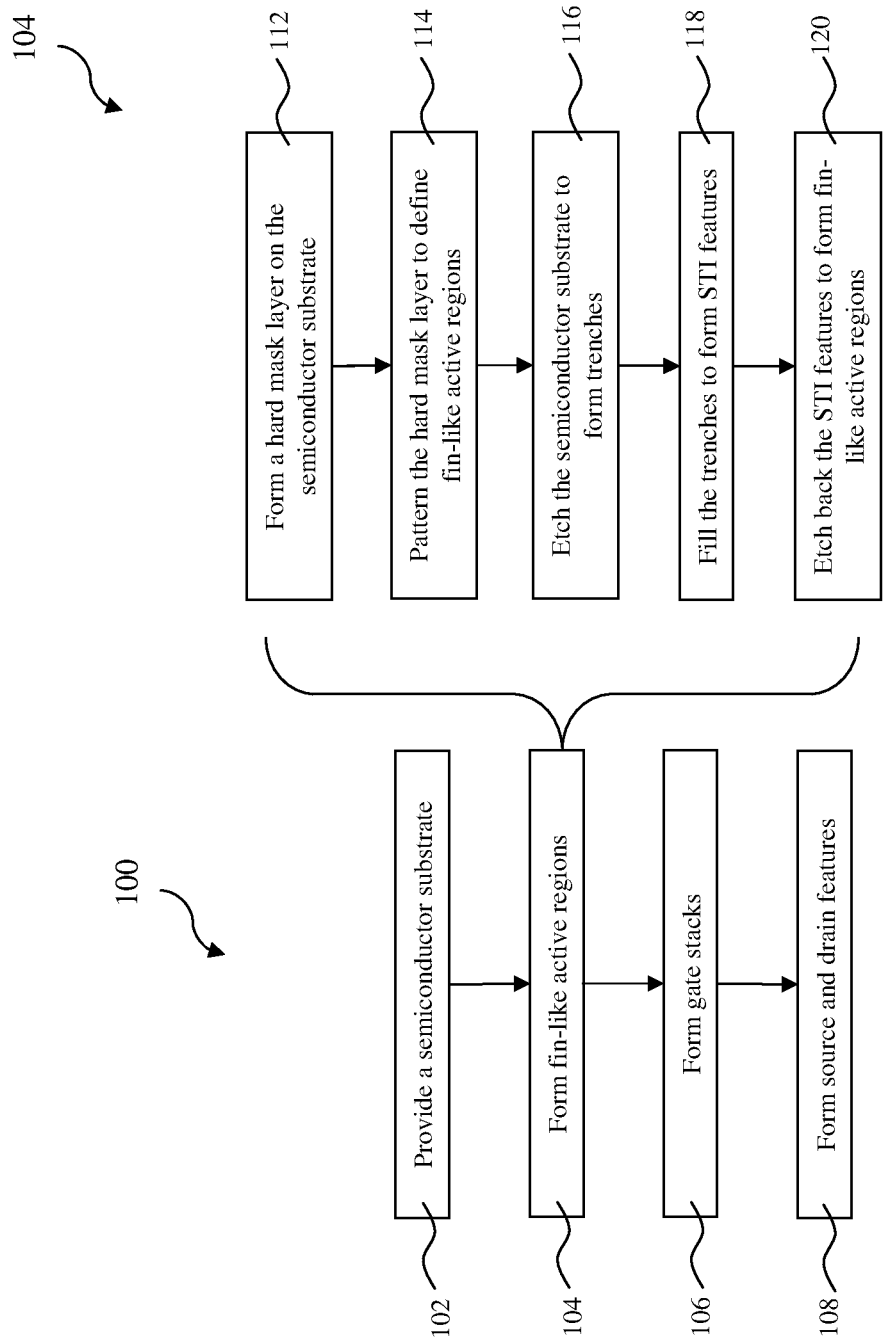

STRUCTURE AND METHOD FOR TRANSISTOR WITH LINE END EXTENSION

BACKGROUND

In advanced technologies of integrated circuit industry, strained semiconductor structures are used to increase the carrier mobility in the channel and enhance circuit performance. Epitaxy growth is a step implemented to form the strained structure. However, the epitaxy growth is sensitive to the structure of the active regions and the corresponding environment. In one example, facet defects are formed and constrain further epitaxy growth. Therefore, a structure of an integrated circuit and a method making the same are needed to address the issues identified above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 4 is a flowchart of a method making the semiconductor structure of FIG. 1.

FIG. 5 is a flowchart of a method making a fin-like active regions in the semiconductor structure of FIG. 1.

DETAILED DESCRIPTION

Figure 1:
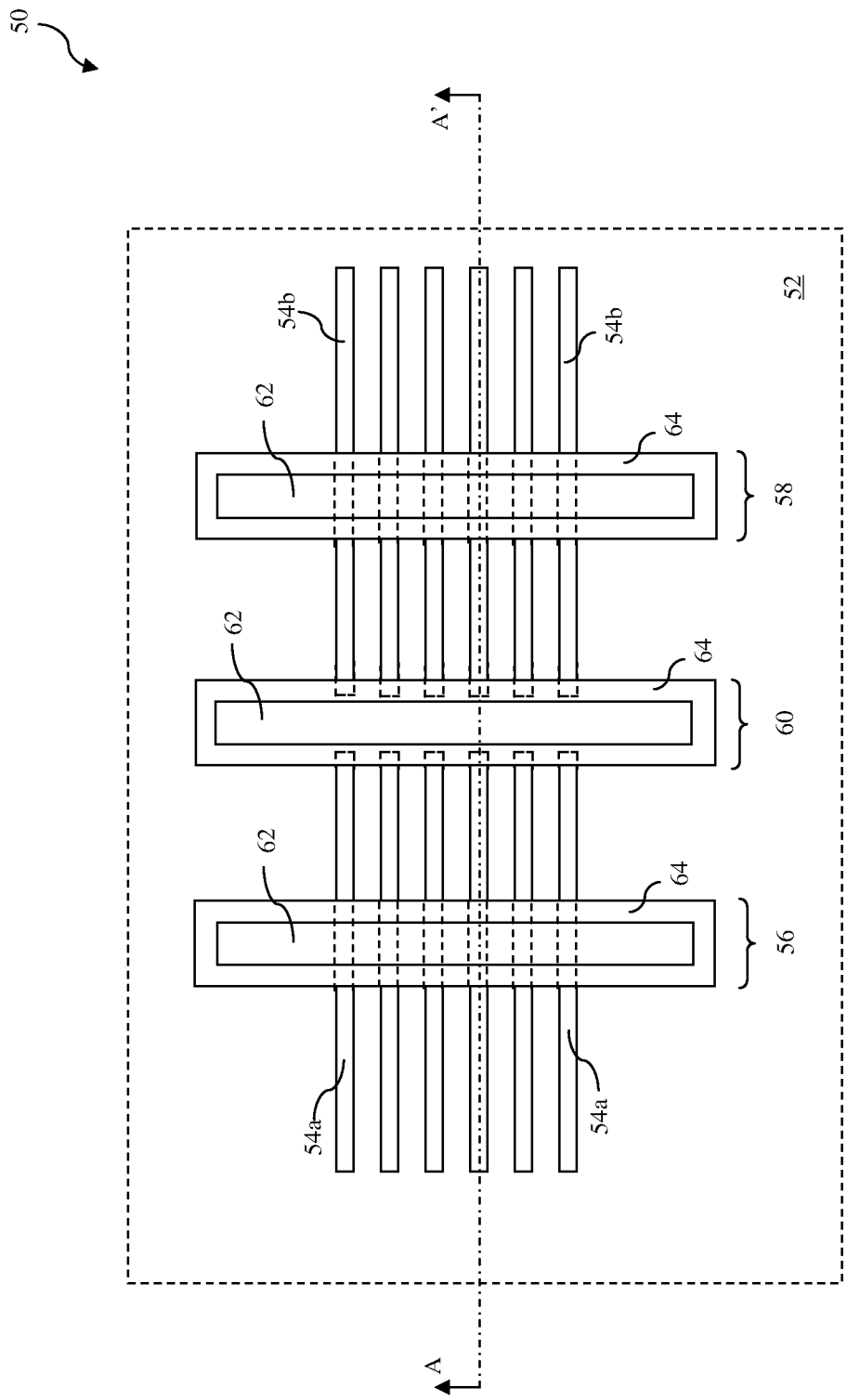
FIG. 1 is a top view of a semiconductor structure constructed according to aspects of the present disclosure in one embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 2:
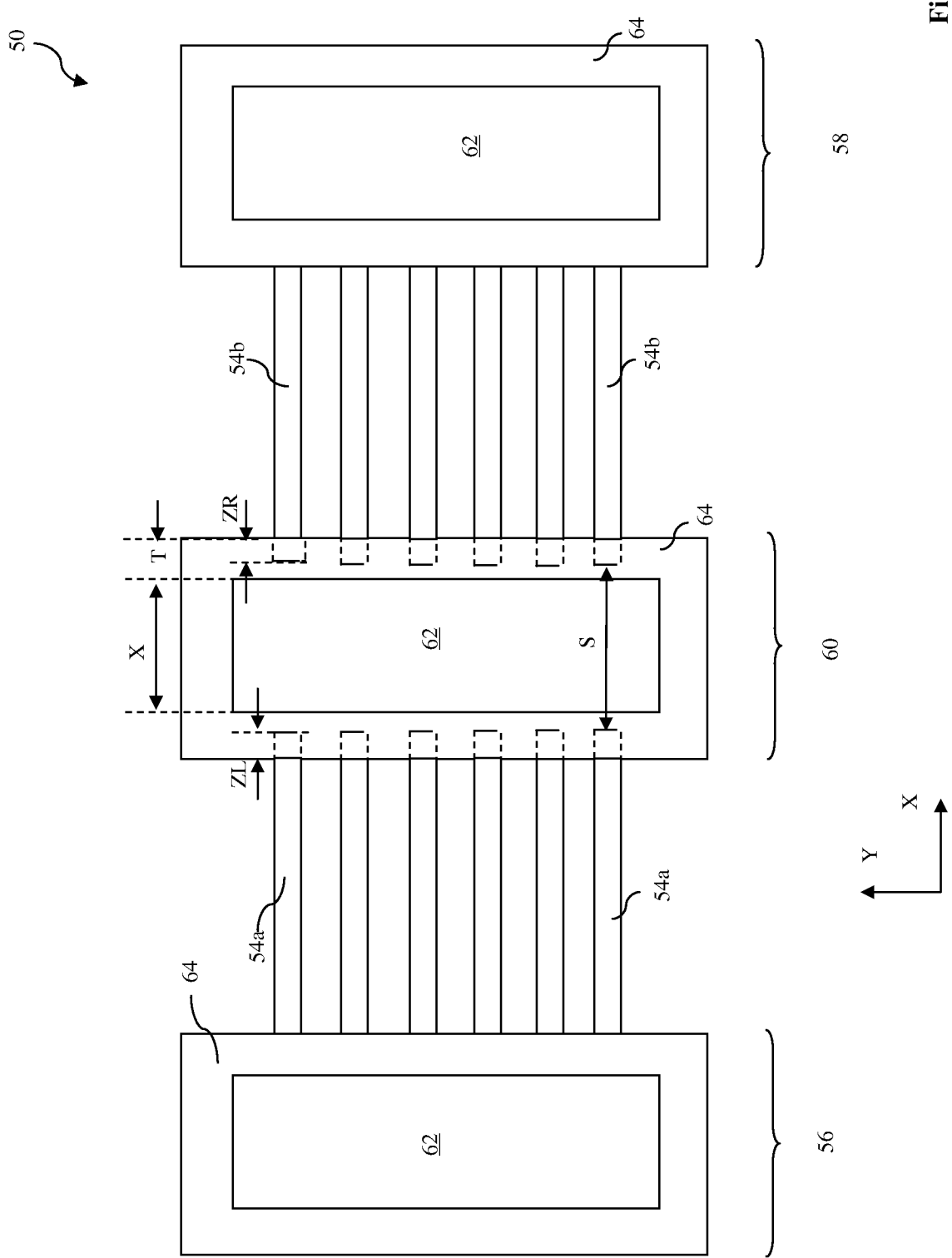
FIG. 2 is a fragmental top view of the semiconductor structure of FIG. 1 constructed according to aspects of the present disclosure in one embodiment.

FIG. 1 is a top view of a semiconductor structure 50 constructed according to aspects of the present disclosure in one embodiment. FIG. 2 is a fragmental top view of the semiconductor structure 50 constructed according to aspects of the present disclosure in one embodiment. The semiconductor structure 50 and the method making the same are collectively described with reference to FIGS. 1 and 2.

In one embodiment, the semiconductor structure 50 is a portion of a semiconductor wafer, or particularly a portion of a semiconductor dice (or a chip). The semiconductor structure 50 includes a semiconductor substrate 52. In one embodiment, the semiconductor substrate includes silicon. Alternatively, the substrate 52 includes germanium or silicon germanium. In other embodiments, the substrate 52 may use another semiconductor material, such as diamond, silicon carbide, gallium arsenic, GaAsP, AlInAs, AlGaAs, GaInP, or other proper combination thereof. Furthermore, the semiconductor substrate 52 may include a bulk semiconductor such as bulk silicon and an epitaxy silicon layer formed on he bulk silicon.

Referring to FIG. 1, the semiconductor structure 50 further includes various active regions 54, such as active regions 54a and 54b. In the present embodiment, the active regions 54 are fin-like structure designed to form fin-like field effect transistors (FinFETs). In a particular embodiment, the semiconductor structure 50 includes a plurality of fin-like active regions configured in parallel, such as a first plurality of fin-like active regions 54a and a second plurality of fin-like active regions 54b. The first plurality of fin-like active regions 54a and the second plurality of fin-like active regions 54b are separated by isolation features. In one example for illustration, the first plurality of fin-like active regions 54a are configured for n-type FinFETs (nFinFETs) and the second plurality of fin-like active regions 54b are configured for p-type FinFETs (pFinFETs). Various isolation features, such as shallow trench isolation (STI) features, are formed on the semiconductor substrate 52 in a procedure to form the fin-like active regions.

The fin-like active regions 54 are formed by a proper technique. In one example, the formation of the fin-like active regions includes forming STI features to define the areas for the active regions, etching the semiconductor material (e.g., silicon) in the active regions, and epitaxy growing a semiconductor material (e.g., silicon) in the active regions to form fin-like active regions 54. In another example, the formation of the fin-like active regions includes forming STI features to define the areas for the active regions, and etching to recess the STI features such that the active regions are extruded to form fin-like active regions 54.

Various gate stacks are formed on the fin-like active regions 54. The gate stacks include one or more functional gate stacks for field effect transistors and a dummy gate stack configured over the isolation features. In the present embodiment, the semiconductor structure 50 includes a first gate stack 56 disposed on the first plurality of fin-like active regions 54a and a second gate stack 58 disposed on the second plurality of fin-like active regions 54b. The first gate stack 56 and the second gate stack 58 are configured to form respective field effect transistors, such as nFinFETs and pFinFETs. Furthermore, the semiconductor structure 50 includes a dummy gate stack 60 disposed on the STI feature and extended to be partially over the active regions 54. Particularly, the dummy gate stack 60 is disposed on the STI features and covers the end portions of the active regions 54 as illustrated in FIG. 1. State differently, the fin-like active regions 54 are extended to the dummy gate 60 such that the end portions of fin-like active regions 54 are underlying the dummy gate stack. In furtherance of the present embodiment, the first plurality of fin-like active regions 54a are extended to the dummy gate stack 60 from one side, and the second plurality of fin-like active regions 54b are extended to the dummy gate stack 60 from another side such that the dummy gate stack 60 covers both the ends of the first plurality of fin-like active regions 54a and the ends of the second plurality of fin-like active regions 54b.

In one embodiment, each of the gate stacks 56, 58 and 60 includes a main gate 62 and a gate spacer 64 formed on the sidewalls of the corresponding main gate 62. Each main gate of the gate stacks 56, 58 and 60 includes a gate dielectric feature and a gate electrode disposed on the gate dielectric feature. The gate dielectric feature includes one or more dielectric material and the gate electrode includes one or more conductive material. The gate spacer includes one or more dielectric material.

Further referring to FIG. 2, the configuration of the dummy gate stack is described with details. FIG. 2 is a top view of the semiconductor structure 50 of FIG. 1 in portion for simplicity. In the present embodiment, the fin-like active regions 54 are aligned in a first direction X and the gate stacks are aligned in a second direction Y perpendicular to the first direction. The dummy gate 60 includes the main gate 62 and the gate spacer 64 on the sidewalls. The main gate 62 includes a width X defined in the first direction. The gate spacer 64 includes a thickness T on each side illustrated in FIG. 2. The first fin-like active regions 54a have end portions embedded in (underlying) the dummy gate stack 60. Each embedded end portion of the first fin-like active regions 54a has a dimension ZL defined in the first direction. The second fin-like active regions 54b have end portions embedded in (underlying) the dummy gate stack 60. Each embedded end portion of the second fin-like active regions 54b has a dimension ZR in the second direction. The first fin-like active regions 54a and the second fin-like active regions 54b are spaced from each other in the first direction with a spacing dimension S. Various parameters defined above satisfies an equation as S1+ZL+ZR=X+2T. In one embodiment, the dimensions ZL and ZR of the embedded end portions of the fin-like active regions 54 range between about 5 nm and about 10 nm. In another embodiment, the dummy gate stack 60 has a different width than that of functional gate stack, such as the functional gate stack 56 or 58. The parameters ZL and ZR define the overlaps between the fin-like active regions (54a or 54b) and the dummy gate stack 60. The parameters ZL and ZR also define the offsets between the edges of the dummy gate stack 60 and the edges of the isolation feature underlying the dummy gate stack 60.

Figure 3:
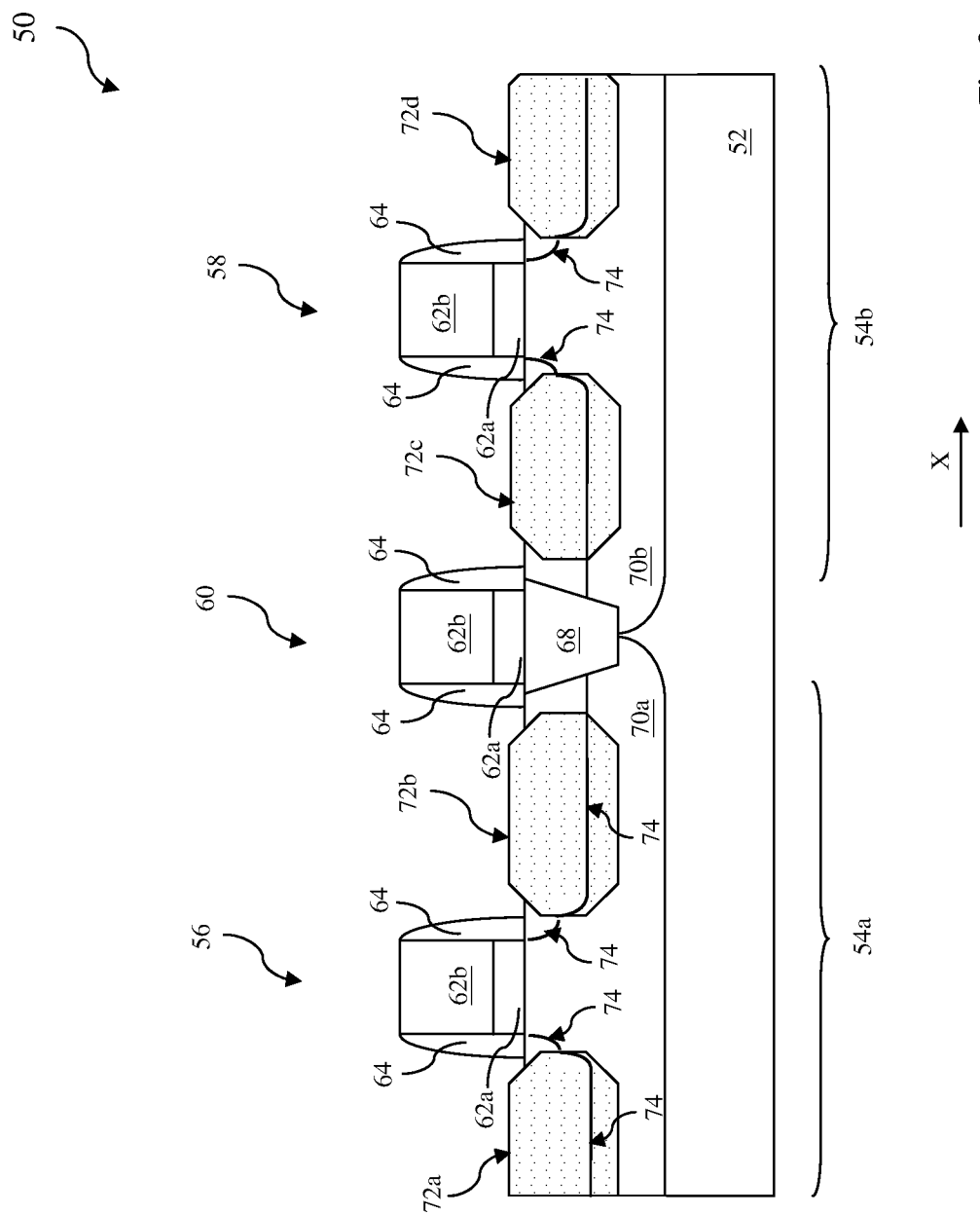
FIG. 3 is a sectional view of the semiconductor structure of FIG. 1 along line AA' constructed according to aspects of the present disclosure in one embodiment.

FIG. 3 is a sectional view of the semiconductor structure 50 taken along a dashed line AA' in FIG. 1 constructed according to one embodiment of the present disclosure. More features are illustrated in FIG. 3 with following descriptions. The semiconductor structure 50 includes functional gate stacks 56 and 58 and further includes a dummy gate stack 60 disposed between the functional gate stacks. The dummy gate 60 is formed on the isolation feature 68 and extended in the first direction X to the end portions of the fin-like active regions 54.

Various doped features are disposed in the semiconductor substrate 52 and are formed by proper technologies, such as ion implantation. For example, one or more doped wells 70 are formed in the active regions. In one embodiment, a first well 70a is formed in the first fin-like active regions 54a and a second well 70b is formed in the second fin-like active regions 54b. In furtherance of the embodiment, the first well 70a includes a p-type dopant for nFinFETs and the second well 70b includes a n-type dopant for pFinFETs.

The semiconductor structure 50 includes one or more epitaxy grown semiconductor features (epi features) 72 for strained effect to enhance the circuit performance. In one embodiment, the semiconductor structure 50 includes epi features 72a and 72b disposed on the both sides of the first functional gate 56. In another embodiment, the semiconductor structure 50 includes epi features 72c and 72d disposed on the both sides of the second functional gate 58. In the present embodiment, the epi features 72a, 72b, 72c and 72d are present. Particularly, the epi features 72a and 72b include epi grown silicon carbide with the strain effect tuned to enhance the performance of nFinFETs formed in the active regions 54a and the epi features 72c and 72d include epi grown silicon germanium with the strain effect tuned to enhance the performance of pFinFETs formed in the active regions 54b. The epi features are extended to the dummy gate stack 60 but are spaced away from the isolation feature 68, due the offset of the dummy gate 60 to the isolation feature 68.

The formation of the epi features includes etching the semiconductor substrate to form the recesses and epi growing to form the corresponding epi features, such as silicon germanium or silicon carbide. In one embodiment, epi features 72 may be grown to extrude above the surface of semiconductor substrate 52.

During the etching process to form the recesses, the recesses is offset from the isolation feature 68 by the dummy gate 60 such that the sidewalls of the isolation feature 68 are exposed, resulting in the recesses with surfaces of only semiconductor material (silicon in the present embodiment). Accordingly, the epi growth substantially occurs in the surfaces of the recesses and the facet defect issue is eliminated.

In the existing method, the recesses expose the surfaces of the isolation feature (STI feature). The epi growth cannot grow on the surface of the isolation feature that is dielectric material, such as silicon oxide. Void defects are formed between the epi features and the isolation features. Those void defects are referred to as facet defects. In contrast, the disclosed semiconductor structure 50 and the corresponding method eliminate the facet defects.

The semiconductor structure 50 further includes source and drain features 74 formed in the active regions 54 (e.g., 54a and 54b) and respectively disposed on the sides of the corresponding functional gate stack (56 or 58). The source and drain features 74 include light doped drain (LDD) features substantially aligned with the corresponding main gate stack and the heavily doped source and drain (S/D) aligned with the corresponding gate spacer 64. The LDD features and the heavily doped S/D are collectively referred to as source and drain features 74. The source and drain features 74 are formed by various steps of ion implantation. In the present embodiment, the source and drain features 74 in the first active regions 54a have n-type dopant, such as phosphorous, configured to form nFinFETs. The source and drain features 74 in the second active regions 54b have p-type dopant, such as boron, configured to form pFinFETs.

The gate stacks (including the functional gate stacks 56 and 58 and the dummy gate stack 60) include the main gates 62 and the gate spacers 64. Each main gate stack 62 includes a gate dielectric feature 62a and a gate electrode 62b disposed on the gate dielectric feature 62a. The gate dielectric features 62a include one or more dielectric materials disposed on the semiconductor substrate 52. The gate electrodes 62b include one or more conductive materials. In one embodiment, the gate dielectric features 62a include silicon oxide and the gate electrodes 62b include polysilicon, formed by a procedure including deposition and patterning. The patterning includes lithography process and etch process.

In another embodiment, the gate dielectric features 62a include a high k dielectric material layer and the gate electrodes 62b include a metal layer, referred to as high k metal gates. The high k metal gates may be formed by proper procedure, such as gate-last procedure where polysilicon gate stacks are formed first and then replaced by etching, deposition and polishing. In this embodiment, the gate dielectric features 62a may additionally include an interfacial layer (IL) disposed between the semiconductor substrate and the high k dielectric material layer. The gate electrodes 62b may include a metal film of a proper work function to the respective transistors according to type (n-type or p-type) for tuned threshold voltage, therefore referred to as work function metal. In this case, the work function metal for nFinFETs are different from the work function metal for pFinFETs.

In yet another embodiment, the functional gate stacks 56 and 58 includes the high k dielectric material layer for gate dielectric and the metal layer for gate electrode but the dummy gate include silicon oxide for gate dielectric and polysilicon for gate electrode.

FIG. 4 is a flowchart of a method 100 forming the semiconductor structure 50 constructed according to aspects of the present disclosure according to one or more embodiments. The method 100 is described with reference to FIGS. 1 through 4.

The method 100 begins at step 102 by providing a semiconductor substrate 52. The semiconductor substrate 52 includes silicon or alternatively other suitable semiconductor material.

The method 100 proceeds to step 104 by forming fin-like active regions 54. In one embodiment, the fin-like active regions 54 are formed by a procedure including forming STI features to define the areas for the active regions, and etching back the STI features such that the active regions are extruded to form the fin-like active regions 54.

In furtherance of the embodiment, a more detailed procedure for the formation of the fin-like active regions 54 is provided below with reference to FIG. 5 as a flowchart of forming the fin-lie active regions according to various embodiments.

At step 112, a hard mask is formed on the semiconductor substrate. In one example, the hard mask includes a silicon oxide film (pad oxide) and a silicon nitride film on the pad oxide. The hard mask layer may be formed by a proper techniques. In one example, silicon oxide is formed by thermal oxidation and silicon nitride is formed by chemical vapor deposition (CVD).

At step 114, the hard mask layer is patterned to form various openings. The patterned hard mask layer define the areas for isolation features and areas for active regions. Particularly, the openings of the patterned hard mask layer define the areas for the isolation features. The hard mask layer is patterned by lithography process and etching process.

Figure 6:
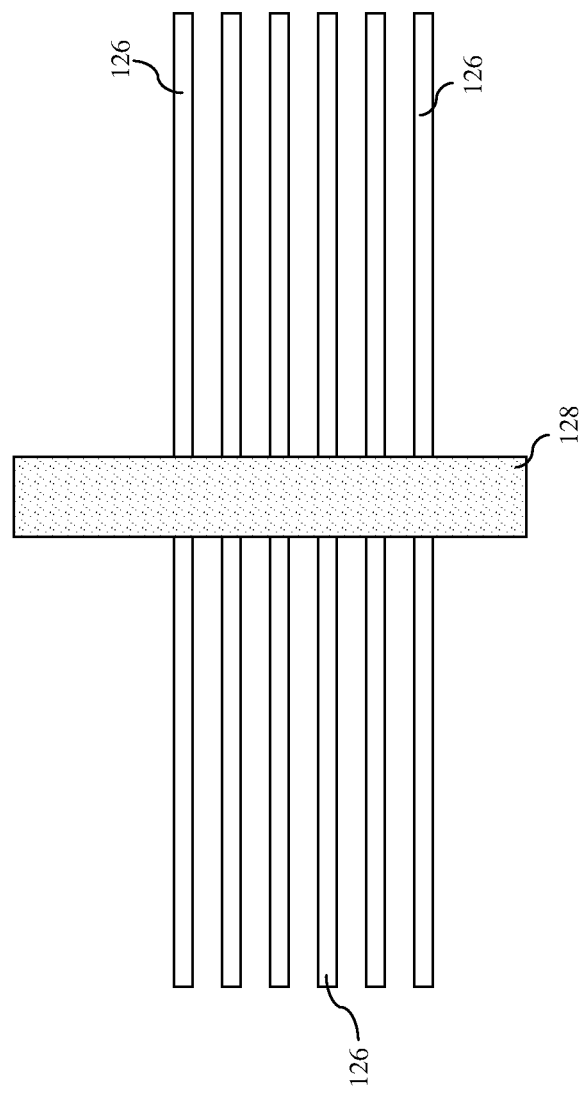
FIG. 6 is a schematic diagram to illustrate patterning a hard mask for forming the fin-like active regions in the semiconductor structure of FIG. 1.

To reduce the line end shortening and corner rounding issues, two photomasks are used to pattern the hard mask layer. The first photomask defines fin lines and the second photomask defines line end cut patterns and creates end-to-end spacing. As illustrated in FIG. 6 as a top view of the hard mask layer, the first photomasks defines fin features 126 and the second photomask defines line end cut patterns 128 to form the fin-like active regions 54 of the semiconductor structure 50. In one example, the first photomask defines the fin features aligned in a first direction X and the second photomask defines the line end cut feature 128 aligned in a second direction Y perpendicular to the first direction X.

In one embodiment, the two photomasks are utilized in a double exposure procedure. A photoresist layer is coated on the hard mask layer. Two exposures are implemented sequentially with the first and second photomasks, respectively. Then the double exposed photoresist layer is developed to form a patterned photoresist layer with openings defined therein. An etching process follows to etch the hard mask layer through the openings of the patterned photoresisit layer. The lithography process may include other steps, such as soft baking post-exposure baking and/or hard baking. The etching process may include two etch steps to respectively etch silicon nitride and silicon oxide.

In another embodiment, the two photomasks are utilized in a double exposure and double etching procedure. A first photoresist layer is patterned (coating, exposure and developing) using the first photomask. Then an etching process follows to etch the hard mask layer through the openings of the first photoresist layer. Similarly, a second photoresist layer is patterned using the second photomask. Then an etching process follows to etch the hard mask layer through the openings of the second photoresist layer.

At step 116, the semiconductor substrate is etched through the openings of the hard mask layer, forming trenches in the semiconductor trenches. The pattern of the hard mask layer is transferred to the semiconductor substrate.

At step 118, the trenches of the semiconductor substrate are filled with one or more dielectric materials to form shallow trench isolation (STI) features. In one embodiment, the shallow trench isolation features include silicon oxide. The silicon oxide can be filled in the trenches by a CVD process. In various examples, the silicon oxide can be formed by a high density plasma chemical vapor deposition (HDPCVD). The silicon oxide may be alternatively formed by a high aspect ratio process (HARP). In another embodiment, the trench isolation features may include a multi-layer structure. In furtherance of the embodiment, the STI features include other suitable materials, such as silicon nitride or silicon oxynitride.

In one embodiment, a polishing process, such as chemical mechanical polishing (CMP), is followed to remove the excessive dielectric material on the semiconductor substrate and planarize the surface.

At step 120, the STI features are etched back such that the STI features are recessed and the semiconductor portions (silicon portions) are extruded relative to the recessed STI features, resulting in fin-like active regions. Accordingly, the top surface of the STI features is lower than the top surface of the fin-like active regions.

Referring back to FIG. 4, after the formation of the fin-like active regions at step 104, the method 100 proceeds to step 106 by forming gate stacks, including the functional gate stacks (56 and 58) and the dummy gate stack 60. As illustrated in FIG. 3, the gate stacks (including the functional gate stacks 56 and 58 and the dummy gate stack 60) include the main gates 62 and the gate spacers 64. Each main gate stack 62 includes a gate dielectric feature 62a and a gate electrode 62b disposed on the gate dielectric feature 62a. In various embodiments, the gate stacks may include polysilicon or metal for gate electrode and may include silicon oxide and/or high k dielectric material for gate dielectric. When the gate stacks include high k dielectric and metal (referred to as high k metal gates), the formation of the high k metal gates may implement gate-first process where the high k dielectric material and metal directly deposited and patterned at this step. Alternatively, high k metal gates may be formed by other techniques, such as gate-last process or high-k-last process in various embodiments.

The method 100 proceeds to step 108 by forming source and drain features 74 in the active regions 54 (e.g., 54a and 54b). The source and drain features are respectively disposed on the sides of the corresponding functional gate stack (56 or 58). In one embodiment, the source and drain features 74 include light doped drain (LDD) features substantially aligned with the corresponding main gate stack and the heavily doped source and drain (S/D) aligned with the corresponding gate spacer 64. The source and drain features 74 are formed by proper technique (such as ion implantation) and are followed by thermal anneal for activation. In the present embodiment, the source and drain features 74 in the first active regions 54a include n-type dopant configured to form nFinFETs. The source and drain features 74 in the second active regions 54b include p-type dopant configured to form pFinFETs.

The formation of the gate stacks and the formation of the source and drain features are integrated in one procedure. For example, the heavily doped source and drain are formed after the formation of the gate spacer. One embodiment of the procedure to form gate stacks and the source/drain features is described below.

The gate material layers are formed on the substrate and patterned to form gate stacks. The gate material layers include an interfacial layer (such as silicon oxide) and a high k dielectric material disposed on the interfacial layer and a polysilicon layer on the high k dielectric material layer. The patterning technique includes lithography process and etching. A hard mask may be utilized as an etch mask to pattern the gate material layers.

The LDD features are then formed by ion implantation and may be followed by thermal anneal for activation. The gate spacers are formed on the sidewalls of the gate stacks by deposition and dry etch. Particularly, the dummy gate stack 60 (including gate spacer) is formed to land on the STI feature 68 and is extended to cover end portions of the fin-like active regions 54. In the present embodiment, the dummy gate 60 covers the end portions of the fin-like active regions 54a on one side and covers the end portions of the fin-like active regions 54b on another side.

The semiconductor substrate is then etched to form recesses. In the present embodiment, silicon substrate is etched using a proper etchant. The recesses are formed in the silicon substrate and are separated from the STI feature 68 by silicon. The offsets between the edge of the STI feature 68 and the edge of the dummy gate stack 60 are ZL and ZR, respectively, as illustrated in FIG. 2. The offsets ZL and ZR are designed to be enough such that the recesses cannot reach and expose the STI feature 68.

Then the epitaxy growth (or epi growth) is implemented to form epi grown features of a semiconductor material different from the substrate to achieve proper strain effect for enhanced channel mobility. In one embodiment, the silicon germanium is epi grown in the recesses for pFinFETs. In another embodiment, the silicon carbide is epi grown in the recesses for nFinFETs.

The epi growth may grow the epi features substantially coplanar with the surface of the silicon surface or alternatively higher than the silicon surface such that the epi features are extruded out. Heavily doped source and drain are formed by ion implantation after the epitaxy growth.

In another embodiment, the gate spacer used for recess etching is removed and a second gate spacer is formed on the sidewalls of the gate stack. Thus, the second gate spacer is tuned to offset the heavily doped source and drain while the first gate spacer is tuned to offset the overlap of the fin end and the dummy gate stack.

In yet another embodiment, heavily doped source and drain are formed during the epi growth wherein the epi features are in situ doped during the epi growth. The precursor of the ep growth includes chemical to introduce the dopant simultaneously during the epi growth.

Other processing steps may be implemented before, during and/or after the method 100. In one embodiment, an interlayer dielectric (ILD) layer is formed on the substrate and the gate stack. The ILD layer is deposited by a proper technique, such as CVD. The ILD includes a dielectric material, such as silicon oxide, low k dielectric material or a combination. Then a chemical mechanical polishing (CMP) process may be applied thereafter to polarize the surface of the ILD. In one example, the gate stack is exposed by the CMP process for the subsequent processing steps. In the gate-last process to form high k metal gates, the polysilicon layer is replaced by one or more metals after the formation of the ILD layer. More specifically, the polysilicon layer in the gate stacks is removed by etching, resulting in gate trenches. Then the gate trenches are filled by one or more metal materials, forming metal gate stacks. In the present embodiment, a first metal having a proper work function is deposited in the gate trenches and a second metal is disposed on the first metal to fill the gate trenches. The first metal is also referred to as work function metal. The second metal may include aluminum or tungsten.

In the high-k-last process, both the gate dielectric and the polysilicon are removed by etching. Afterward, the high k dielectric material and metal are then filled in to form high k metal gate stacks.

In another example, an interconnect structure is further formed on the substrate and is designed to couple various transistors and other devices to form a functional circuit. The interconnect structure includes various conductive features, such as metal lines for horizontal connections and contacts/vias for vertical connections. The various interconnect features may implement various conductive materials including copper, tungsten and silicide. In one example, a damascene process is used to form copper-based multilayer interconnect structure. In another embodiment, tungsten is used to form tungsten plug in the contact holes.

Although not shown, other features and the processing steps making these features may present, including various device features such as silicide for contact, and multilayer interconnection (MLI). In one example, the silicide contact layer includes nickel silicide, cobalt silicide, tungsten silicide, tantalum silicide, titanium silicide, platinum silicide, erbium silicide, palladium silicide, or combinations thereof. The gate spacers may have a multilayer structure and may include silicon oxide, silicon nitride, silicon oxynitride, or other dielectric materials.

Although embodiments of the present disclosure have been described in detail, those skilled in the art should understand that they may make various changes, substitutions, and alterations herein without departing from the spirit and scope of the present disclosure. For example, the semiconductor structure 50 includes fin-like active regions. However, the present disclosure is also applicable to a two-dimensional circuit wherein the active regions and the STI features are substantially coplanar. The overlap between the dummy gate stack and the end portion of the active regions, as disclosed, can be implemented to reduce the facet defects when the epi features are incorporated in the field effect transistors for strain effect. In another example, the dummy gate 60 has a width different from the functional gate stack such that the overlap between the dummy gate and the active regions is tuned to effectively prevent the facet issue. In yet another example, the dummy gate may include different materials, such as silicon oxide and polysilicon while the functional gate stacks include high k dielectric material and metal. In yet another embodiment, only silicon germanium epi features are formed in the pFinFETs while the nFinFETs have source and drain features formed in the silicon substrate.

Thus, the present disclosure provides a semiconductor structure. The semiconductor structure includes a semiconductor substrate; an isolation feature formed in the semiconductor substrate; a first active region and a second active region formed in the semiconductor substrate, wherein the first and second active regions extend in a first direction and are separated from each other by the isolation feature; and a dummy gate disposed on the isolation feature, wherein the dummy gate extends in the first direction to the first active region from one side and to the second active region from another side.

In one embodiment, the semiconductor structure further includes a first functional gate disposed on the first active region and configured to form a first field effect transistor; and a second functional gate disposed on the second active region and configured to form a second field effect transistor.

In another embodiment, the semiconductor structure further includes first epitaxy features formed on the first active region and interposed by the first functional gate stack. In yet another embodiment, the semiconductor substrate includes silicon; the first epitaxy features include silicon germanium; and the first field transistor includes one of a p-type field effect transistor and a n-type field effect transistor, wherein the first epitaxy features are separated from the dummy gate by a portion of the semiconductor substrate.

In another embodiment, the semiconductor structure further includes second epitaxy features formed on the second active region and interposed by the second functional gate stack. In yet another embodiment, the second epitaxy features include silicon carbide; and the second field transistor includes another one of the p-type field effect transistor and n-type field effect transistor, wherein the second epitaxy features are separated from the dummy gate by another portion of the semiconductor substrate.

In yet another embodiment, the first and second functional gates each include a high k dielectric material layer and a metal layer on the high k dielectric material layer.

In yet another embodiment, the isolation feature is a shallow trench isolation (STI) feature extending a first dimension S1 in the first direction. In another embodiment, the first active region and the second active region are fin-like active regions aligned in the first direction; and the dummy gate aligned in a second direction perpendicular to the first direction and spanning a second dimension S2 in the first direction, wherein the second dimension is greater than the first dimension.

In yet another embodiment, the dummy gate extends to the first active region with a first overlap dimension Z1 in the first direction; and the dummy gate extends to the second active region with a second overlap dimension Z2 in the first direction, wherein the S1, S2, Z1 and Z2 are related in a formula S2=S1+Z1+Z2. In yet another embodiment, the dummy gate includes a main gate stack and a gate spacer disposed on both sides of the main gate stack; the main gate stack has a width W in the first direction and the gate spacer has a thickness T; and the second dimension S2 is equal to W+2T.

The present disclosure also provides another embodiment of a semiconductor structure. The semiconductor structure includes a silicon substrate; first plurality of fin-like active regions formed in the silicon substrate and oriented in a first direction; second plurality of fin-like active regions formed in the silicon substrate and oriented in the first direction; a shallow trench isolation (STI) feature formed in the silicon substrate and interposed between the first fin-like active regions and the second fin-like active regions; and a dummy gate disposed on the STI feature, wherein the dummy gate extends in the first direction to overlap with the first fin-like active regions from one side and to overlap with the second fin-like active regions from another side.

In one embodiment of the semiconductor structure, the first fin-like active regions each include a first end contacting the STI feature and the second fin-like active regions each include a second end contacting the STI feature.

In another embodiment, the STI feature spans a first dimension S1 in a first direction; the first ends and the second ends have a first distance in the first direction, wherein the first distance is equal to the first dimension S1; and the dummy gate spans a second dimension S2 in the first direction, S2 being greater than S1.

In yet another embodiment, the dummy gate overlaps with the first fin-like active regions of a first overlap dimension Z1 in the first direction; the dummy gate overlaps with the second fin-like active regions of a second overlap dimension Z2 in the first direction; and S1, S2, Z1 and Z2 are related in a formula S2=S1+Z1+Z2.

In yet another embodiment, the STI feature includes a top surface lower than top surfaces of the first and second fin-like active regions.

The present disclosure also provides an embodiment of a method that includes forming an isolation feature in a semiconductor substrate; forming a first fin-like active region and a second fin-like active region in the semiconductor substrate and interposed by the isolation feature; forming a dummy gate stack on the isolation feature, wherein the dummy gate extends to the first fin-like active region from one side and to the second fin-like active region from another side.

In one embodiment, the method further includes forming epitaxy grown source and drain features in the first fin-like active region. In another embodiment, the forming of the dummy gate stack includes forming a first gate having polysilicon and replacing the polysilicon with metal.

In yet another embodiment, the forming of the isolation feature and the forming of the first fin-like active region and the second fin-like active region include forming a hard mask using a first photomask defining an active region and a second photomask defining a cut feature, wherein the hard mask includes openings defining the first and second fin-like active regions.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. A semiconductor structure, comprising:
an isolation feature formed in a semiconductor substrate;
a first fin and a third fin, adjacent to the first fin, extending in a first direction on the semiconductor substrate and a second fin and a fourth fin, adjacent to the second fin, extending in the first direction on the semiconductor substrate and being collinear with the first fin and third fin respectively, wherein the isolation feature interposes the first fin and the second fin, and the isolation feature interposes the first fin and the third fin, such that a first contiguous region of insulating material is disposed between the first fin and the third fin, and a second contiguous region of insulating material is disposed between the first fin and the second fin;

a first active region in the first fin and a second active region in the second fin, wherein the first and second active regions extend in a first direction and are separated from each other by the second contiguous region of insulating material of the isolation feature;

a dummy gate disposed on the second contiguous region of insulating material of the isolation feature and extending over end regions of at least the first fin and the third fin;

a first functional gate disposed on the first active region and configured to form a first field effect transistor;

a second functional gate disposed on the second active region and configured to form a second field effect transistor;

a first epitaxy source/drain feature formed in a trench in the first active region of the first fin and interposing the first functional gate and the dummy gate in the first direction, wherein a bottom edge of the first epitaxy feature is below a top surface of the isolation feature and wherein a sidewall of the trench nearest the dummy gate is defined by a semiconductor material of the first fin, wherein the first epitaxy source/drain feature is separated from the second contiguous region of insulating material of the isolation feature by a portion of the semiconductor material of the first fin the portion having a length in the first direction that is defined by a distance the dummy gate extends over the end region of the first fin.

2. The semiconductor structure of claim 1, wherein
the semiconductor substrate includes silicon;
the first epitaxy source/drain feature includes silicon germanium; and
the first field transistor includes one of a p-type field effect transistor and a n-type field effect transistor.

3. The semiconductor structure of claim 1, further comprising a second epitaxy feature formed on the second active region and interposing the dummy gate and the second functional gate.

4. The semiconductor structure of claim 3, wherein
the second epitaxy feature includes silicon carbide; and
the second field transistor includes one of a p-type field effect transistor and a n-type field effect transistor,
wherein the second epitaxy feature is separated from the second contiguous region of insulating material of the isolation feature another portion of the semiconductor substrate.

5. The semiconductor structure of claim 1, wherein the first and second functional gates each include a high k dielectric material layer and a metal layer on the high k dielectric material layer.

6. The semiconductor structure of claim 1, wherein the isolation feature is a shallow trench isolation (STI) feature and the second contiguous region of insulating material of the isolation feature extends a first dimension S1 in the first direction.

7. The semiconductor structure of claim 6, wherein
the dummy gate aligned in a second direction perpendicular to the first direction and spanning a second dimension S2 in the first direction,
wherein the second dimension is greater than the first dimension.

8. The semiconductor structure of claim 7, wherein
the dummy gate extends to the first active region with a first overlap dimension Z1 in the first direction; and
the dummy gate extends to the second active region with a second overlap dimension Z2 in the first direction, wherein the S1, S2, Z1 and Z2 are related in a formula S2=S1+Z1+Z2.

9. The semiconductor structure of claim 8, wherein
the dummy gate includes a main gate stack and a gate spacer disposed on both sides of the main gate stack;
the main gate stack has a width W in the first direction and the gate spacer has a thickness T; and
the second dimension S2 is equal to W+2T.

10. The semiconductor structure of claim 1, further comprising:
a third active region in the third fin;
a third functional gate disposed on the third active region and configured to form a third field effect transistor; and
a third epitaxy feature formed in the third active region and interposing the third functional gate and the dummy gate, wherein the third epitaxy feature is separated from the second contiguous region of insulating material by a second portion of the semiconductor substrate having a second length, wherein the second length is defined by a distance the dummy gate extends over the end region of the third fin.

11. A semiconductor structure, comprising:
first plurality of adjacent fin-like active regions formed in a silicon substrate and oriented in a first direction;
second plurality of adjacent fin-like active regions formed in the silicon substrate and oriented in the first direction;
a shallow trench isolation (STI) feature formed in the silicon substrate and interposed between the first plurality of adjacent fin-like active regions and the second plurality of adjacent fin-like active regions;
a dummy gate disposed on the STI feature and oriented in a second direction substantially perpendicular to the first direction, wherein the dummy gate has a length that extends in the first direction to extends over end regions of the first plurality of adjacent fin-like active regions from one side and extending over end regions of the second plurality of adjacent fin-like active regions from another side;
a first functional gate oriented in the second direction and disposed on each of the first plurality of adjacent fin-like active regions;
a second functional gate oriented in the second direction and disposed on each of the second plurality adjacent of fin-like active regions; and
a first source/drain epitaxy feature formed on a first fin of the first plurality of adjacent fin-like active regions, wherein a bottom and two opposing sidewalls of the first source/drain epitaxy feature interface the first fin of the silicon substrate, wherein the first source/drain epitaxy feature interposes the first functional gate and the STI feature and is substantially coplanar with the STI feature, wherein the first source/drain epitaxy feature is separated from the STI feature by a portion of the first fin of the silicon substrate having a length of silicon material in the first direction, the length defined by a distance the dummy gate extends over the end region of the first fin.

12. The semiconductor structure of claim 11, wherein the first plurality of fin-like active regions each include a first end contacting the STI feature and the second plurality of fin-like active regions each include a second end contacting the STI feature.

13. The semiconductor structure of claim 12, wherein
the STI feature spans a first dimension S1 in a first direction;
the first ends and the second ends have a first distance in the first direction, wherein the first distance is equal to the first dimension S1; and the dummy gate spans a second dimension S2 in the first direction, S2 being greater than S1.

14. The semiconductor structure of claim 13, wherein the dummy gate overlaps with the first fin-like active regions of a first overlap dimension Z1 in the first direction;

the dummy gate overlaps with the second fin-like active regions of a second overlap dimension Z2 in the first direction; and S1, S2, Z1 and Z2 are related in a formula $S2=S1+Z1+Z2$.

15. The semiconductor structure of claim 11, wherein the STI feature includes a top surface lower than top surfaces of the first and second fin-like active regions.

* * * * *